(12) United States Patent
Farkas et al.

(10) Patent No.: US 12,490,373 B2
(45) Date of Patent: Dec. 2, 2025

(54) SYSTEM AND METHOD TO MAINTAIN SIGNAL INTEGRITY BETWEEN MULTIPLE SIGNAL PATHS CONNECTING TWO TRACES IN A PRINTED CIRCUIT BOARD

(71) Applicant: Dell Products L.P., Round Rock, TX (US)

(72) Inventors: Sandor Tibor Farkas, Round Rock, TX (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 269 days.

(21) Appl. No.: 18/318,561

(22) Filed: May 16, 2023

(65) Prior Publication Data

US 2024/0389223 A1 Nov. 21, 2024

(51) Int. Cl.
*H05K 1/02* (2006.01)
*H05K 1/11* (2006.01)

(52) U.S. Cl.
CPC ......... *H05K 1/0251* (2013.01); *H05K 1/0228* (2013.01); *H05K 1/115* (2013.01)

(58) Field of Classification Search
None
See application file for complete search history.

(56) References Cited

U.S. PATENT DOCUMENTS

2004/0188138 A1* 9/2004 Baras ............... H05K 1/0216
174/261
2018/0293345 A1* 10/2018 Shen ............... H05K 1/0296

* cited by examiner

*Primary Examiner* — Timothy J Thompson
*Assistant Examiner* — John B Freal
(74) *Attorney, Agent, or Firm* — McDermott Will & Schulte LLP

(57) ABSTRACT

In one or more embodiments, a printed circuit board (PCB) may be configured for reduced insertion loss between traces. Two traces on different layers may be connected by two vias and two connector traces on different layers, wherein one connector trace may have a first length and a second connector trace may have a second length that is longer than the first length such that a first portion of a signal transmitted along a first signal path through the first connector trace arrives at the second trace at substantially the same time as a second portion of the sign transmitted along a second signal path through the second connector trace.

12 Claims, 5 Drawing Sheets

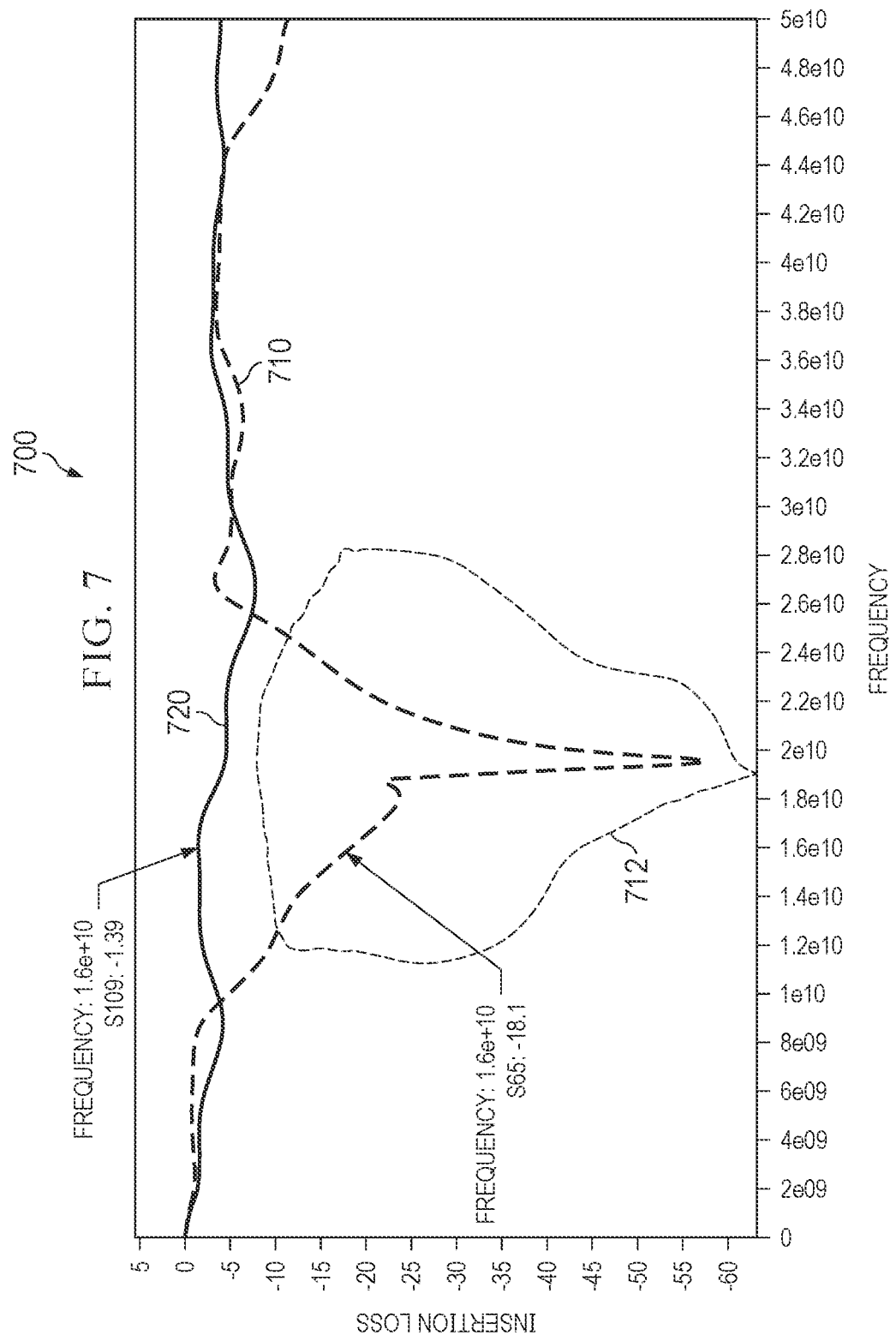

SYSTEM AND METHOD TO MAINTAIN SIGNAL INTEGRITY BETWEEN MULTIPLE SIGNAL PATHS CONNECTING TWO TRACES IN A PRINTED CIRCUIT BOARD

BACKGROUND

Field of the Disclosure

This disclosure relates generally to information handling systems and more particularly to maintaining signal integrity between traces in a printed circuit board.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be generally directed to a system for electrically connecting a first trace in a printed circuit board (PCB) with a second trace in the PCB. The system may comprise a pair of vias extending through a plurality of layers in the PCB and a pair of connector traces connecting the pair of vias. A first stub of a first via of the pair of vias, a first connector trace of the pair of connector traces and a first stub of a second via of the pair of vias form a first signal path such that a first portion of a signal is transmitted along the first signal path to reach the second trace at a first time. A second stub of the first via, a second connector trace of the pair of connector traces and a second stub of the second via form a second signal path such that a second portion of the signal is transmitted along the second signal path to reach the second trace at a second time substantially equal to the first time.

In some embodiments, the second connector trace is formed with a minimum length. In some embodiments, the first connector trace comprises a plurality of linear segments, wherein a first linear segment is arranged angularly relative to a second linear segment. In some embodiments, the first connector trace comprises one or more curved segments. In some embodiments, a total impedance of each of the first signal path and the second signal path is approximately two times greater than an impedance of the first trace or the second trace. In some embodiments, an impedance of the first signal path is substantially equal to an impedance of the second signal path. In some embodiments, at least one layer of the plurality of layers is formed on an external surface of the PCB.

Some embodiments may be generally directed to a printed circuit board (PCB), comprising a plurality of layers, a first trace on a first layer of the plurality of layers, a second trace on a second layer of the plurality of layers, a pair of vias extending through the plurality of layers, and a pair of connector traces connecting the pair of vias, wherein a first via of the pair of vias is connected to the first trace and a second via of the pair of vias is connected to the second trace. A first stub of a first via of the pair of vias, a first connector trace of the pair of connector traces and a first stub of a second via of the pair of vias form a first signal path such that a first portion of a signal is transmitted along the first signal path to reach the second trace at a first time. A second stub of the first via, a second connector trace of the pair of connector traces and a second stub of the second via form a second signal path such that a second portion of the signal is transmitted along the second signal path to reach the second trace at a second time substantially equal to the first time.

In some embodiments, the second connector trace is formed with a minimum length. In some embodiments, the first connector trace comprises a plurality of linear segments, wherein a first linear segment is arranged angularly relative to a second linear segment. In some embodiments, the first connector trace comprises one or more curved segments. In some embodiments, a total impedance of each of the first signal path and the second signal path is approximately two times greater than an impedance of the first trace or the second trace. In some embodiments, an impedance of the first signal path is substantially equal to an impedance of the second signal path. In some embodiments, at least one layer of the plurality of layers is formed on an external surface of the PCB.

Some embodiments may be generally directed to a method of forming a printed circuit board (PCB), comprising forming a first trace on a first layer of a plurality of layers in the PCB; forming a second trace on a second layer of the plurality of layers; connecting a first via to the first trace; connecting a second via to the second trace; forming a first connector trace to connect the first via to the second via on a third layer of the plurality of layers, wherein the first connector trace has a first connector trace length such that a first portion of a signal is transmitted along the first signal path and arrives at the second trace at a first time; and forming a second connector trace to connect the first via to the second via on a fourth layer of the plurality of layers, wherein the second connector trace has a second stub trace length such that a second portion of the signal is transmitted along the second signal path and arrives at the second trace at a second time substantially equal to the first time.

In some embodiments, the method comprises forming the second connector trace with a minimum length. In some embodiments, forming the first connector trace comprises configuring the first connector trace with a plurality of linear segments, wherein a first linear segment is arranged angularly relative to a second linear segment. In some embodiments, forming the first connector trace comprises configuring the first connector trace with one or more curved segments. In some embodiments, the method comprises configuring the first connector trace and the second connector trace such that a total impedance of each of the first signal path and the second signal path is approximately two times greater than an impedance of the first trace or the second trace. In some embodiments, the method comprises configuring the first connector trace and the second connector trace such that an impedance of the first signal path is substantially equal to an impedance of the second signal path.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which:

FIG. 7 depicts a chart illustrating live model results illustrating signal insertion loss over a range of frequencies for a PCB with turnaround vias backdrilled compared to a PCB with a system with two vias connected by two stub traces according to one embodiment.

DETAILED DESCRIPTION

Figure 1:
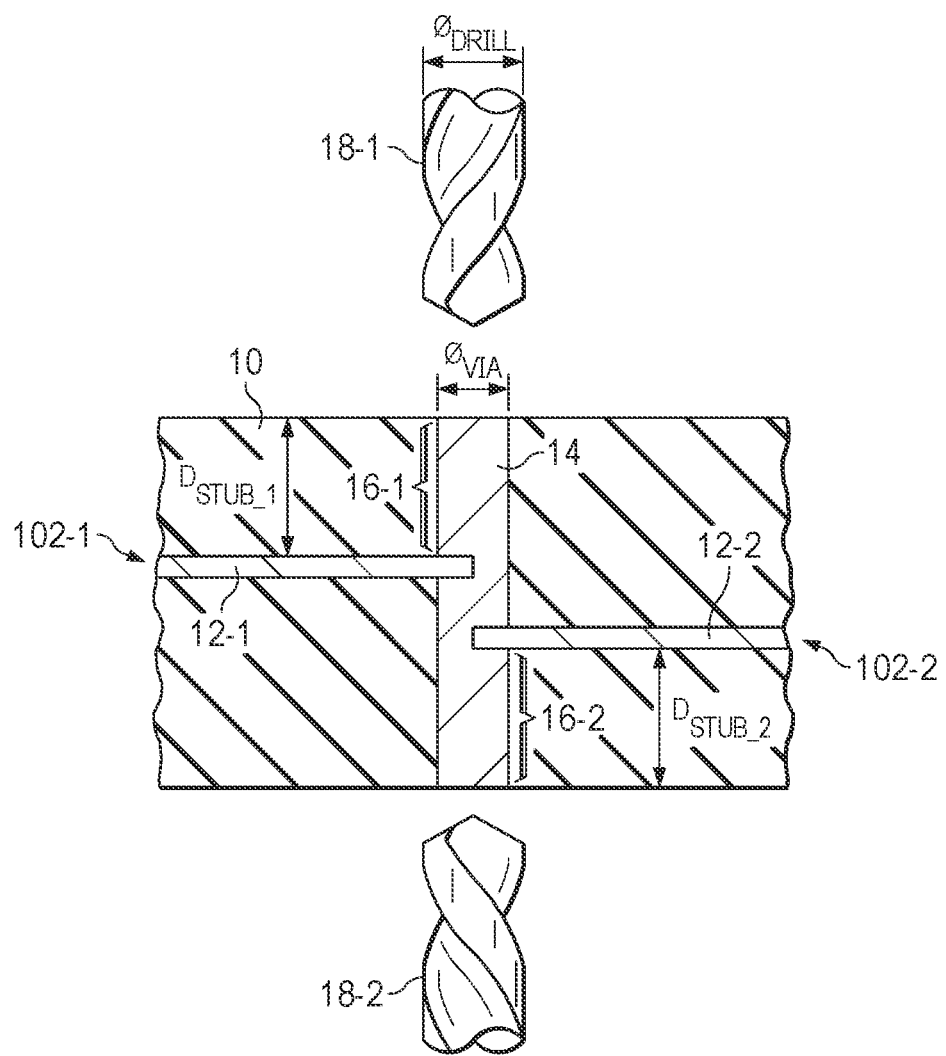
FIG. 1 depicts a partial side view of an example of a printed circuit board (PCB) with a single via connecting two traces, with stubs at both ends of the via.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a via referenced by '14-1' may refer to a particular instance of a particular class/type, and the reference '14' may refer to a collection of vias belonging to that particular class/type or any one instance of that class/type in general.

Single Via Connections

Turning now to FIG. 1, a side partial view of a portion of an example printed circuit board (PCB) 10 is illustrated. As depicted in FIG. 1, traces 12-1 and 12-2 are on different layers 102-1 and 102-2 internal to PCB 10. However, PCBs 10 are typically formed with multiple layers 102, including layers 102 on external surfaces (e.g., a top surface and a bottom surface), and a trace 12 may be on any internal layer 102. PCB 10 may be formed with one or more vias 14. Each via 14 may connect traces 12 on two or more layers. As depicted in FIG. 1, via 14 connects traces 12-1 and 12-2.

Signal Reflections Result in Destructive Signals

In theory, a signal transmitted from trace 12-1 to trace 12-2 travels along via 14. However, unused portions (also referred to as "stubs") 16 of via 14 act like transmission lines such that a first portion of the signal arrives at the second trace 12-2 at a first time and a second portion of the signal may be reflected and arrive at the second trace 12-2 at a second time. As the length of a stub 16 increases, the difference in arrival times also increases, resulting in stub interference that leads to channel insertion loss, which negatively affects signal integrity.

Backdrilling to Remove Stubs

Still referring to FIG. 1, a common approach to reduce channel insertion loss is to backdrill PCB 10 to eliminate all stubs 16 such that signals are not reflected. Generally, backdrilling generally refers to a process that includes advancing drill bits 18 (with drill bit diameters $\varnothing_{DRILL}$) in PCB 10 to remove stubs 16 of via 14, and resin filling the holes in PCB 10 formed by drill bits 18. Referring to FIG. 1, for PCBs 10 with a single via 14, backdrilling may be necessary on both sides of PCB 10 (e.g., drill bit 18-1 may be advanced a first depth ($D_{STUB\_1}$) on a first side of PCB 10 to remove stub 16-1 and drill bit 18-2 may be advanced a second depth ($D_{STUB\_2}$) on a second side of PCB 10 to remove stub 16-2). Backdrilling both sides of PCB 10 adds complexity (discussed in greater detail below) and further increases the cost of manufacturing PCB 10.

Two Via Connections Reduce Cost but do not Eliminate Stub Resonance

Figure 2:
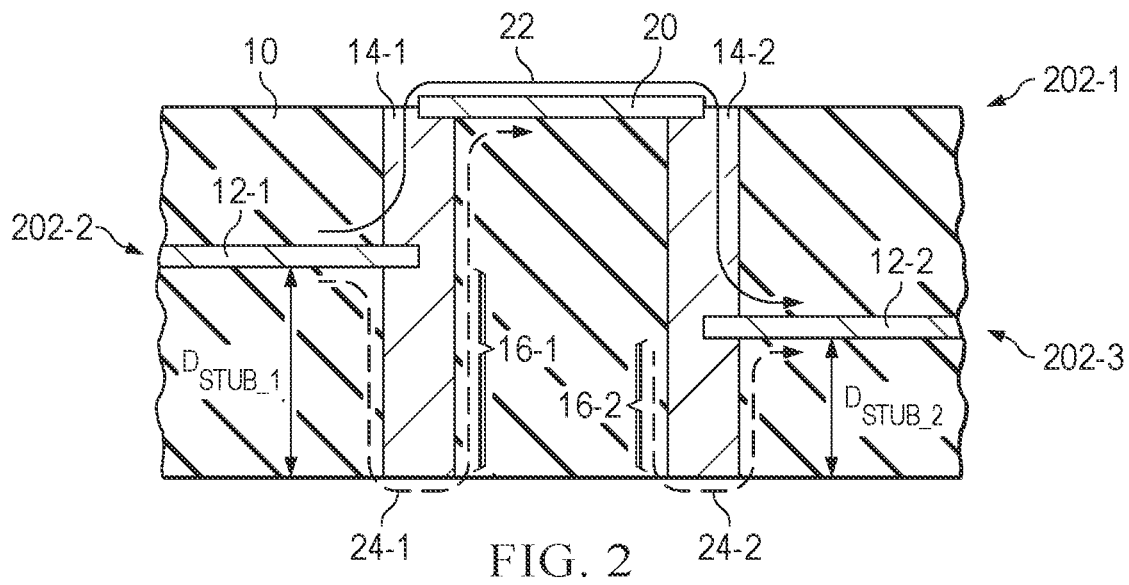
FIG. 2 depicts a partial side view of an example of a PCB with two vias and a single stub trace connecting two traces, illustrating destructive signal reflections associated with stubs on each via.

Referring to FIG. 2, another approach to try to eliminate stub resonance in PCB 10 involves forming PCB 10 with traces 12-1 and 12-2 on two different layers 202 (e.g., layers 202-2 and 202-3), connecting the two traces 12 using two vias 14 (e.g., vias 14-1 and 14-2) and connecting the two vias 14 with a connector trace 20 on a third layer (e.g., layer 202-1). Advantageously, this approach allows for backdrilling on a single side of PCB 10 to reduce some of the complexity and cost of connecting traces 12-1 and 12-2. Additionally, for some PCBs 10, a third trace 20 (referred to hereinafter as connector trace 20) may be formed on an external surface (e.g., layer 202-1), reducing complexity and cost for preventing stub resonance.

In theory, this approach would enable a signal to follow an intended signal path 22 (e.g., from trace 12-1, through via 14-1, connector trace 20 and via 14-2 to trace 12-2). However, this approach does not eliminate stub interference. Instead, when a signal is transmitted from trace 12-1 to trace 12-2, a portion of the signal follows an intended signal path 22, but other portions of the signal may be reflected in one or more of stubs 16-1 and 16-2, causing portions of the signal to follow reflected signal paths 24. For example, a portion may follow a first reflected signal path 24-1 (e.g., a portion of the signal may be reflected in stub 16-1 in via 14-1) and a portion may follow a second reflected signal path 24-2 (e.g., a portion of the signal may be reflected in stub 16-2 in via 14-2). Portions of a signal following a reflected signal path 24 may also be referred to as reflected portions. Reflected portions following reflected signal paths 24 may be delayed arriving at second trace 12-2 (e.g., portions of a signal following paths 24-1 and/or 24-2 may arrive at trace 12-2 later than the portion following intended signal path 22). A large time difference between when two portions of the signal arrive at second trace 12-2 may result in reflected portions of the signal acting as a comb filter or otherwise destructively combining with the portion following the intended signal path 22.

Once a signal is distorted by stub resonance, it is practically impossible to undo this effect at the receiver, leading to increased bit errors. Input/Output (IO) signaling speeds are expected to reach or exceed 64 Gbps (Gigabits per second) to 128 Gbps in the next few years, making stub resonance a big challenge.

Figure 3:
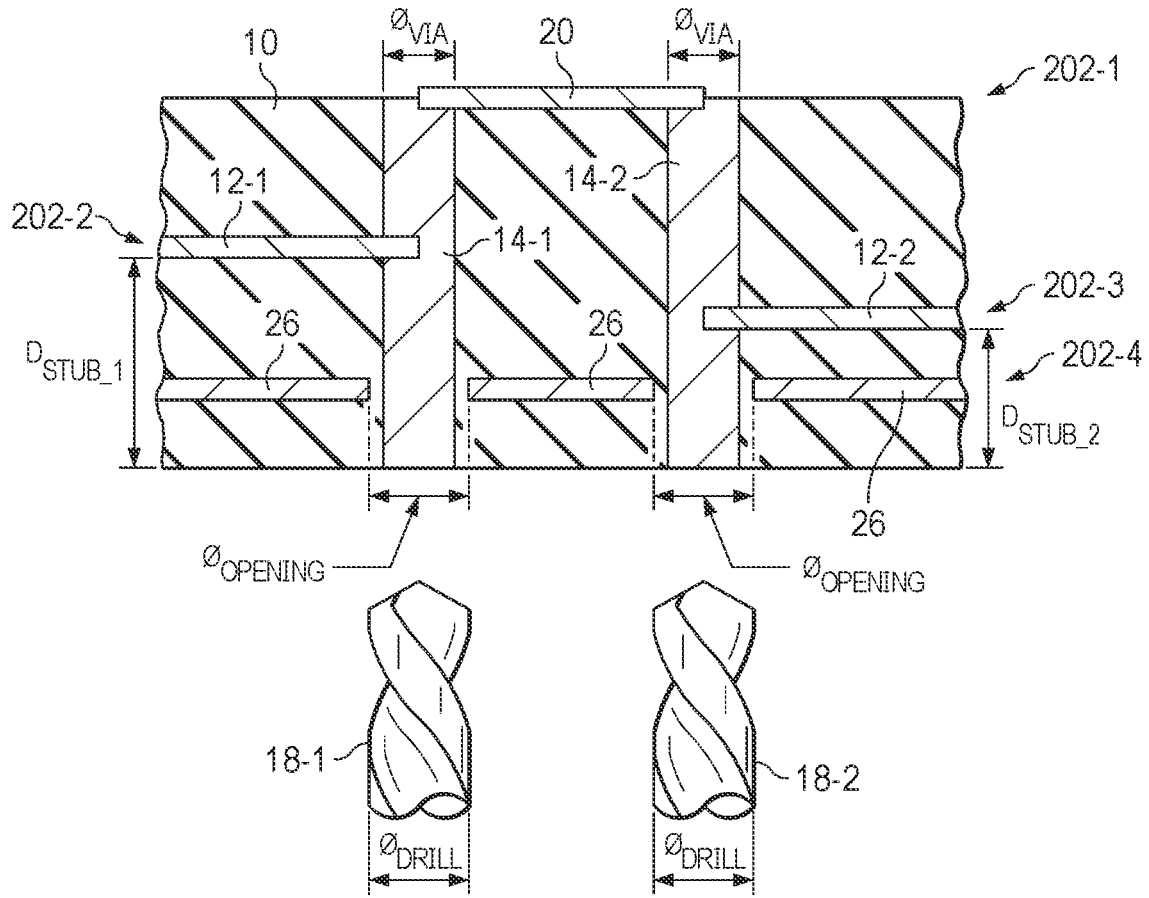
FIG. 3 depicts a partial side view of the example PCB in FIG. 2 with the vias backdrilled to prevent the destructive signal reflection, illustrating sources of possible damage to other layers.

Backdrilling Turnaround Vias to Eliminate Stub Resonance can Damage Other Layers in a PCB High density PCB board designs use many layer transitions such that stub resonance is more complicated and difficult to avoid. FIG. 3 depicts a side partial view of an example PCB 10 having connector trace 20 on first layer 202-1, first trace 12-1 on layer 202-2, second trace 12-2 on third layer 202-3 and plane 26 on forth layer 202-4, wherein vias 14-1 and 14-2 and connector trace 20 connect traces 12-1 and 12-2. Plane 26 may be another signal layer (e.g., a signal layer with less routing space with backdrill keepouts), a power plane or a grounding plane, for example.

Backdrilling from a single side of PCB 10 reduces some of the costs of manufacturing PCB 10. However, one or more drill bits 18 may need to be advanced farther into PCB 10 to eliminate a stub 16. As depicted in FIG. 3, drill bit 18-1 may need to be advanced a first depth ($D_{STUB\_1}$) to layer 202-2 to remove stub 16-1, whereas drill bit 18-2 may need to be advanced a second depth ($D_{STUB\_2}$) to layer 202-3 to remove stub 16-2.

As the depth ($D_{STUB}$) that drill bit 18 needs to be advanced to remove stubs 16 increases, drill bit 18 is more likely to impact plane 26 or other layers. For example, FIG. 3 depicts plane 26 associated with layer 202-4. As drill bits 18 are advanced into PCB 10 to backdrill stubs 16-1 and 16-2, the larger diameters $\emptyset_{DRILL}$ of drill bits 18 may increase a diameter ($\emptyset_{OPENING}$) of openings in plane 26. Increasing the diameter ($\emptyset_{OPENING}$) of openings in plane 26 may damage or negatively affect performance of plane 26 or PCB 10.

Embodiments disclosed herein may reduce or eliminate stub interference without backdrilling vias 14. Methods described herein may reduce the complexity and costs for manufacturing a PCB (including reducing the likelihood for damage to a PCB, traces 12 and planes 26). Embodiments may also allow more options for arranging components on layers in a PCB and routing signals and power in the PCB.

Connector Traces with Different Path Lengths Reduce Signal Delays

Figure 4:
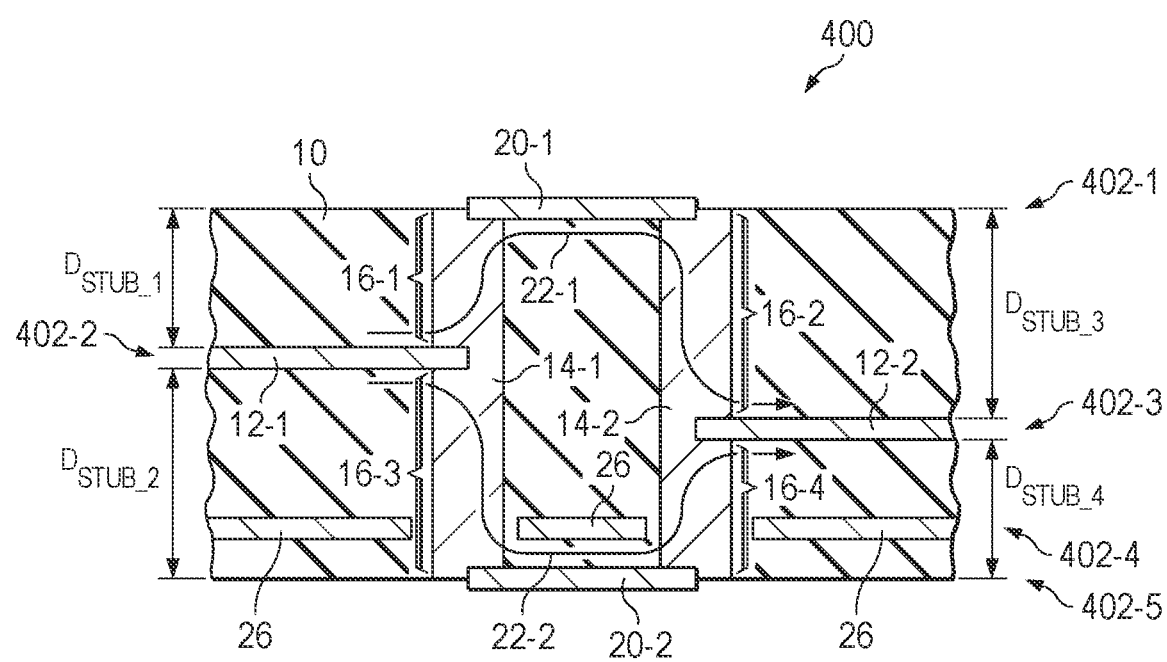
FIG. 4 depicts a side partial view of a PCB with an embodiment of a system for maintaining signal integrity between two traces.
Figure 5:
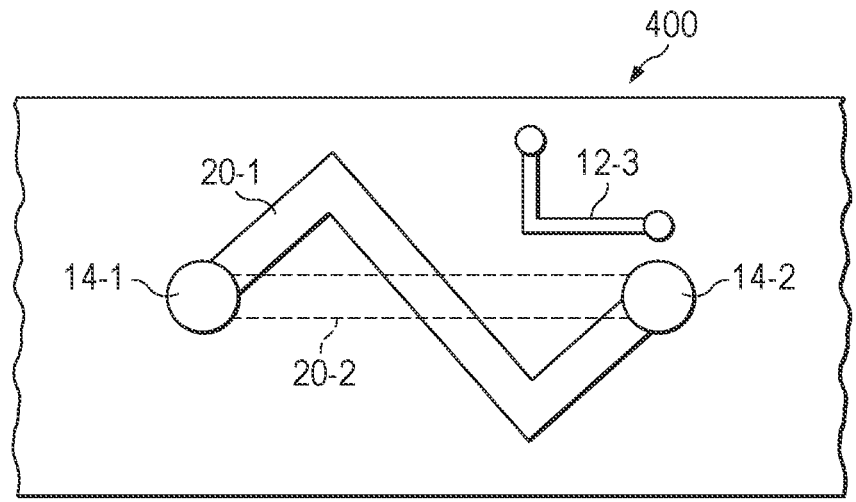
FIG. 5 depicts a top partial view of a PCB with an embodiment of a system for maintaining signal integrity between two traces with a stub trace formed with a plurality of segments oriented at angles.
Figure 6:
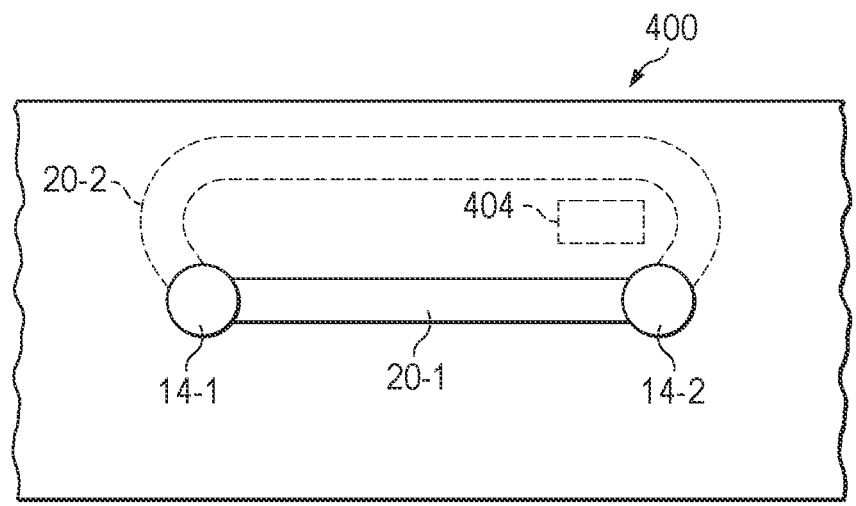
FIG. 6 depicts a top partial view of a PCB with an embodiment of a system for maintaining signal integrity between two traces with a stub trace formed with one or more curved segments.

Referring to one or more of FIGS. 4, 5 and 6, embodiments may comprise PCB 400 having multiple layers 402, with a first trace 12-1 connected to a second trace 12-2 by two vias 14-1 and 14-2, which are connected by stub traces 20-1 and 20-2, wherein a length of one or more connector traces 20 may be configured to reduce or eliminate a signal delay. First connector trace 20-1 may be formed on layer 402-1, first trace 12-1 may be located on second layer 402-2, second trace 12-2 may be located on third layer 402-3, plane 26 may be formed on layer 402-4 and second connector trace 20-2 may be formed on layer 402-5. As depicted in FIG. 4, layers 402-1 and 402-5 may be located on outer surfaces of PCB 400, but embodiments also allow all layers 402 to be formed internally. Furthermore, each of first connector trace 20-1, second connector trace 20-2, first trace 12-1, second trace 12-2 and plane 26 may be formed on other layers 402 in PCB 10.

Referring to FIG. 4, a signal from first trace 12-1 on layer 402-2 may be transmitted to second trace 12-2 on layer 402-3 using two signal paths 22-1 and 22-2. First signal path 22-1 may comprise first via stub 16-1, first connector trace 20-1 and second via stub 16-2, wherein first signal path 22-1 may have a first impedance. Second signal path 22-2 may comprise third via stub 16-3, second connector trace 20-2 and fourth via stub 16-4, wherein second signal path 22-2 may have a second impedance. First stub 16-1 may have a first depth ($D_{STUB\_1}$), second stub 16-2 may have a second depth ($D_{STUB\_2}$), third stub 16-3 may have a third depth ($D_{STUB\_3}$) and fourth stub 16-4 may comprise a fourth depth ($D_{STUB\_4}$), wherein each stub 16 may have a depth different from any other stub 16 or two or more stubs 16 may have the same depth.

In some embodiments, the first impedance and the second impedance are substantially equal. In some embodiments, each of the first impedance and the second impedance are substantially two times an impedance associated with traces 12. Advantageously, having the two impedances matching and approximately twice the impedance of traces 12 may ensure a signal transmitted from trace 12-1 to trace 12-2 is divided approximately equal between the two signal paths 22.

Referring to FIGS. 5 and 6, to ensure a portion of a signal transmitted along first signal path 22-1 reaches second trace 12-2 at substantially the same time as a portion of the signal transmitted along second signal path 22-2 (e.g., with no delay), first connector trace 20-1 and second connector trace 20-2 may be configured with different lengths. In some embodiments, one connector trace 20 may be configured to have a minimum length (e.g., formed as a straight line). In some embodiments, neither connector trace 20 is configured in a straight line.

As depicted in FIG. 5, in some embodiments, first connector trace 20-1 may comprise a plurality of linear segments that are angled relative to each other such that first connector trace 20-1 has a first length to connect first via 14-1 and second via 14-2 such that a signal transmitted along first intended path 22-1 arrives at trace 12-2 at a first time. Second connector trace 20-2 may be formed with a second length that is shorter than the first length. As depicted in FIG. 5, second connector trace 20-2 may be formed as a straight line to have a minimum length. In this configuration of PCB 400, when a signal is transmitted from first trace 12-1 to second trace 12-2, a portion of the signal will be transmitted through first connector trace 20-1 and take longer to transmit along first signal path 22-2 than a portion of the signal that is transmitted through second connector trace 20-2 along second signal path 22-2, resulting in the two portions of the signal transmitted along intended signal paths 22-1 and 22-2 arriving at second trace 12-2 at substantially the same time. A linear segment may be arranged at any angle relative to adjacent linear segments. A linear segment may be longer, shorter, or the same length as adjacent linear segments.

As depicted in FIG. 6, in some embodiments, first connector trace 20-1 may be formed with a first length (e.g., formed as a straight line with a minimum length) to connect first via 14-1 and second via 14-2 and second connector trace 20-2 may be formed with a second length (e.g., formed with a plurality of curved segments) that is longer than the first length such that the portion of a signal transmitted along second signal path 22-2 (e.g., through second connector trace 20-2) may take longer to arrive at second trace 12-2 than the portion of the signal transmitted along first signal path 22-1 (e.g., through first connector trace 20-1), resulting in the two portions of the signal transmitted along intended signal paths 22-1 and 22-2 arriving at second trace 12-2 at substantially the same time. In some embodiments, a curved segment may be defined by a single radius and arc length. In some embodiments, a curved segment may have multiple radii and arc lengths.

Connector Traces May be Configured to Avoid Other Components or Routing of Other Traces Advantageously, first connector trace 20-1 and/or second connector trace 20-2 may be configured to provide a signal path 22 that avoids other traces 12 or components 404.

For example, FIG. 5 depicts an embodiment in which a third trace 12-3 may be close enough to second via 14-2 such that backdrilling second via 14-2 could damage third trace 12-3. Using previous approaches mentioned above, third trace 12-3 may need to be rerouted. Embodiments disclosed herein may prevent stub resonance but do not require rerouting of third trace 12-3. Instead, first connector trace 20-1 may be formed with a plurality of segments angled relative to each other and arranged such that a total length of first connector trace 20-1 is longer than the length of second connector trace 20-2 and first connector trace 20-1 does not affect third trace 12-3. As depicted in FIG. 5, one or more linear segments of first connector trace 20-1 may be arranged relative to other linear segments to avoid contact with or interfering with third trace 12-3.

FIG. 6 depicts an embodiment in which component 404 may be close enough to second via 14-2 such that backdrilling second via 14-2 may damage component 404. Embodiments disclosed herein may prevent stub resonance but do not require relocating component 404. Instead, second connector trace 20-2 may be formed with a plurality of curved segments such that a total length of second connector trace 20-2 is longer than the length of first connector trace 20-1 and second connector trace 20-2 does not affect component 404. As depicted in FIG. 6, second connector trace 20-2 may be formed with curved segments to avoid contact with or interfering with component 404.

In some embodiments, as depicted in FIG. 5, connector traces 20 may be configured to not extend past either via 14. In other embodiments, such as depicted in FIG. 6, a connector trace 20 (e.g., second connector trace 20-2) may be configured to extend past one or both vias 14.

In some embodiments, as depicted in FIG. 5, a connector trace 20 may be configured on both sides of a line between two vias 14 (e.g., a portion of first connector trace 20-1 is on a first side of a straight line connecting vias 14-1 and 14-2 and a second portion of first connector trace 20-1 is on a second side of the line. In other embodiments, such as depicted in FIG. 6, a connector trace 20 (e.g., second connector trace 20-2) may be configured on a single side of a straight line between two vias 14 (e.g., all of second connector trace 20-2 is on a single side of first connector trace 20-2 connecting vias 14-1 and 14-2).

In some embodiments, a length of a connector trace 20 may be based on one or more of an impedance and a depth of one or more stubs 16.

Two Signal Paths of Different Lengths Minimize Insertion Loss Over a Range of Frequencies FIG. 7 depicts a graph 700 of insertion loss relative to frequencies. As illustrated in graph 700, line 710 corresponds to a PCB configured similar to PCB 10 depicted in FIG. 2, with two vias 14 backdrilled and connected by a single connector trace 20. Line 720 corresponds to a PCB configured similar to PCB 400 depicted in one or more of FIGS. 4, 5 and 6, with two vias 14 coupled by two connector traces 20-1 and 20-2 on different layers, wherein one connector trace 20 is longer than the other connector trace 20 to provide two signal paths with substantially no delay.

Line 720 indicates PCB 400 with two vias 14 connected by two connector traces 20 configured with different lengths to ensure two portions of a signal transmitted along two signal paths arrive at the second trace 12-2 at substantially the same time may result in minimal and constant (or substantially constant) insertion loss over a range of frequencies. By way of contrast and referring to region 712 in graph 700, PCB 10 with two vias 14 connected by a single connector trace 20 and backdrilled may experience large insertion loss caused by destructive stub resonance at certain frequencies or over a range of frequencies, such as described above.

Thus, embodiments may provide a system that reduces insertion loss over a range of frequencies such that signal integrity is maintained. Furthermore, embodiments do not need backdrilling, which may reduce waste and costs for manufacturing PCB 400 and result in greater structural integrity of PCB 400.

Once manufactured, PCB 400 may be installed in a chassis in an information handling system. An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for electrically connecting a first trace in a printed circuit board (PCB) with a second trace in the PCB, the system comprising:
    a pair of vias extending through a plurality of layers in the PCB; and
    a pair of connector traces connecting the pair of vias, wherein
        a first stub of a first via of the pair of vias, a first connector trace of the pair of connector traces and a first stub of a second via of the pair of vias form a first signal path such that a first portion of a signal is transmitted along the first signal path to reach the second trace at a first time,
        a second stub of the first via, a second connector trace of the pair of connector traces and a second stub of the second via form a second signal path such that a second portion of the signal is transmitted along the second signal path to reach the second trace at a second time substantially equal to the first time,
    wherein the first connector trace has a first physical length and the second connector trace has a second physical length, the second physical length differing from the first physical length,
    wherein an impedance of the first signal path is substantially equal to an impedance of the second signal path.

2. The system of claim 1, wherein the second connector trace is formed with a minimum length.

3. The system of claim 1, wherein the first connector trace comprises a plurality of linear segments, wherein a first linear segment is arranged angularly relative to a second linear segment.

4. The system of claim 1, wherein the first connector trace comprises one or more curved segments.

5. The system of claim 1, wherein a total impedance of each of the first signal path and the second signal path is approximately two times greater than an impedance of the first trace or the second trace.

6. The system of claim 1, wherein at least one layer of the plurality of layers is formed on an external surface of the PCB.

7. A printed circuit board (PCB), comprising:
    a plurality of layers;
    a first trace on a first layer of the plurality of layers;
    a second trace on a second layer of the plurality of layers;
    a pair of vias extending through the plurality of layers; and
    a pair of connector traces connecting the pair of vias, wherein
        a first stub of a first via of the pair of vias, a first connector trace of the pair of connector traces and a first stub of a second via of the pair of vias form a first signal path such that a first portion of a signal is transmitted along the first signal path to reach the second trace at a first time,
        a second stub of the first via, a second connector trace of the pair of connector traces and a second stub of the second via form a second signal path such that a second portion of the signal is transmitted along the second signal path to reach the second trace at a second time substantially equal to the first time,
    wherein the first connector trace has a first physical length and the second connector trace has a second physical length, the second physical length differing from the first physical length,
    wherein an impedance of the first signal path is substantially equal to an impedance of the second signal path.

8. The PCB of claim 7, wherein the second connector trace is formed with a minimum length.

9. The PCB of claim 7, wherein the first connector trace comprises a plurality of linear segments, wherein a first linear segment is arranged angularly relative to a second linear segment.

10. The PCB of claim 7, wherein the first connector trace comprises one or more curved segments.

11. The PCB of claim 7, wherein a total impedance of each of the first signal path and the second signal path is approximately two times greater than an impedance of the first trace or the second trace.

12. The PCB of claim 7, wherein at least one layer of the plurality of layers is formed on an external surface of the PCB.

* * * * *